(12) United States Patent
Ibaraki

(10) Patent No.: US 7,323,779 B2
(45) Date of Patent: Jan. 29, 2008

(54) SEMICONDUCTOR DEVICE

(75) Inventor: Soichiro Ibaraki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 205 days.

(21) Appl. No.: 11/080,461

(22) Filed: Mar. 16, 2005

(65) Prior Publication Data

US 2005/0253232 A1    Nov. 17, 2005

(30) Foreign Application Priority Data

May 17, 2004   (JP)   .............. 2004-146645

(51) Int. Cl.
*H01L 23/52* (2006.01)
*H01L 23/48* (2006.01)
*H01L 29/40* (2006.01)

(52) U.S. Cl. .............. 257/737; 257/E23.021; 257/778; 257/780; 257/787; 438/64; 438/65; 438/118; 29/842; 29/846

(58) Field of Classification Search ........ 257/E21.514, 257/E23.021, 678, 787, 780, 783, 737, 778, 257/690, 692, 786; 438/666, 117, 618, 64, 438/65, 118; 29/25.01, 842, 846
See application file for complete search history.

(56) References Cited

U.S. PATENT DOCUMENTS 5,060,843 A * 10/1991 Yasuzato et al. ......... 228/179.1
5,536,973 A * 7/1996 Yamaji ...................... 257/737
5,633,204 A * 5/1997 Tago et al. ................. 438/614
5,640,051 A * 6/1997 Tomura et al. ............. 257/778
5,641,996 A * 6/1997 Omoya et al. .............. 257/787
5,667,132 A * 9/1997 Chirovsky et al. ...... 228/180.22
5,764,486 A * 6/1998 Pendse ....................... 361/774
5,813,115 A * 9/1998 Misawa et al. .............. 29/832
5,834,844 A * 11/1998 Akagawa et al. ........... 257/734
5,903,161 A * 5/1999 Amemiya et al. .......... 324/754
6,088,236 A * 7/2000 Tomura et al. ............. 361/783
6,100,597 A * 8/2000 Nakamura .................. 257/787
6,114,187 A * 9/2000 Hayes ........................ 438/106
6,333,555 B1* 12/2001 Farnworth et al. ......... 257/737
6,475,897 B1* 11/2002 Hosaka ....................... 438/617
6,612,024 B1* 9/2003 Sasaki et al. ................ 29/840
6,890,789 B2* 5/2005 Ono et al. .................... 438/64

FOREIGN PATENT DOCUMENTS

JP     2000-243785     9/2000
JP     2003-017530     1/2003

* cited by examiner

*Primary Examiner*—Kenneth Parker
*Assistant Examiner*—Chris C. Chu
(74) *Attorney, Agent, or Firm*—Rabin & Berdo, PC

(57) ABSTRACT

A semiconductor device includes a semiconductor chip. A stepped member having stepped regions is provided on the semiconductor chip. The stepped member, together with a redistribution layer, is encapsulated by an encapsulating resin layer. The stepped member is exemplified by functional bumps and dummy bumps having stepped regions. The dummy bumps are electrically unconnected to the exterior, but are electrically connected to the redistribution layer.

11 Claims, 11 Drawing Sheets

SEMICONDUCTOR DEVICE

BACKGROUND OF THE INVENTION

1. Field of the Invention

The present invention relates to a semiconductor device that includes a semiconductor chip having an outside surface on which an encapsulating resin layer is formed.

2. Description of the Related Art

The downsizing of portable electronic equipment in recent years has made it imperative to miniaturize the semiconductor devices used in such equipment. In response to this need, there have emerged semiconductor devices called "chip size packages" which have nearly the same external dimensions as a semiconductor chip. Chip size packages exist in a number of forms, one of which is known as a "wafer-level chip size package" or "wafer-level chip scale package." Such packages are referred to below by the acronym 'W-CSP.'

Current trends in semiconductor device design include not only increasing of the number of gates but also reducing of simultaneous switching noise during the high-speed operation of LSI chips. To these ends, the power supply and the number of ground pins are tried to increase, and the inductance is tried to decrease. In state-of-the-art devices, sometimes 50% or more of the pins are in fact used as power supply grounds.

Japanese Patent Kokai (Laid-open Application) No. 2000-243785 and No. 2003-17530 teach use of dummy bumps which are not electrically connected to the integrated circuit, in order to prevent semiconductor chip deformation due to pressure exerted by the encapsulating resin.

SUMMARY OF THE INVENTION

In the design approach taken from the package side, there is a need to hold down power supply impedance by rerouting for pad relocation and thereby forming interconnections having a large surface area (or large-width traces).

When interconnections having a large surface area (or a large width) are formed as a result of such rerouting, in prior-art structures and fabrication processes, the encapsulating resin often incurs a large thermal stress upon the application of heat to a W-CSP, thereby diminishing the resin bonding effect and leading to problems such as separation, primarily where the rerouting and the resin are joined to each other.

This problem is thought to be preventable by providing a plurality of dummy bumps so as to divide the encapsulating resin into sections and thereby reduce thermal stress. However, the desired effect has yet to be fully achieved in practice. The problem is particularly acute in cases where interconnections having a large surface area (or large-width traces) have been formed by rerouting.

At the same time, owing to current technical requirements, there also exists a need to hold down the power supply impedance.

It is therefore one object of the present invention to provide a semiconductor device which enhances the resin bonding effect and effectively prevents separation of the encapsulating resin.

Another object of the invention is to provide a semiconductor device which, along with enhancing the resin bonding effect and effectively preventing separation of the encapsulating resin, also minimizes the power supply impedance.

According to a first aspect of the present invention, there is provided an improved semiconductor device that includes a semiconductor chip having a surface (major surface) with an integrated circuit formed thereon. The semiconductor device also includes a redistribution layer which is formed on the major surface side and is electrically connected to the integrated circuit. The semiconductor device also includes an encapsulating resin layer which encapsulates the redistribution layer from the major surface side. The semiconductor device also includes a stepped member formed on the major surface side. The stepped member is encapsulated together with the redistribution layer by the encapsulating resin layer. The stepped member has one or more stepped regions, which define at least part of an entire contact area between the stepped member and the encapsulating resin layer.

In this semiconductor device, the stepped member divides up at least part of the encapsulating resin layer, thereby reducing thermal stress. In addition, the stepped regions of the stepped member, which are in contact with the encapsulating resin layer, have corners which provide an anchoring effect, enabling the stepped member and the encapsulating resin to bond securely to each other. Moreover, the area of contact between the stepped member and the encapsulating resin increases in accordance to the degree that the stepped regions are provided, improving the anchoring effect due to the small irregularities at the surface of the stepped member, and thus achieving a more secure bond. As a result, the resin bonding effect is enhanced, enabling separation of the encapsulating resin to be more effectively prevented.

It is preferable for the stepped regions of the stepped member to be stair-like. The stepped regions preferably have one or more channels, grooves or holes in the surface thereof in contact with the encapsulating resin layer.

It is desirable for the stepped member to be made of an electrically conductive material. In such a case, it is advantageous for the stepped member to be electrically connected to the redistribution layer.

According to a second aspect of the present invention, there is provided another semiconductor device that includes a semiconductor chip having a surface (major surface) with an integrated circuit formed thereon. The semiconductor device also includes a redistribution layer formed on the major surface side of the semiconductor chip. The redistribution layer is electrically connected to the integrated circuit. The semiconductor device also includes a plurality of electrically conductive posts formed on the major surface side of the semiconductor chip. These posts are electrically connected to the redistribution layer. The semiconductor device also includes an encapsulating resin layer which encapsulates the redistribution layer and the posts from the major surface side. The posts include one or more first conductive posts which are electrically connected to the exterior and one or more second conductive posts which are electrically unconnected to the exterior.

In this semiconductor device, the electrically conductive posts divide up the encapsulating resin layer, thereby reducing thermal stress. The first conductive posts and second conductive posts are both electrically connected to the redistribution layer, thereby substantially enlarging the surface area of the redistribution layer to the degree that the second electrically conductive posts are provided. As a result, it is possible to enhance the resin bonding effect, effectively prevent separation of the encapsulating resin, and minimize the power supply impedance.

Preferably, the electrically conductive posts have one or more stepped regions in contact areas between themselves and the encapsulating resin layer. It is advantageous for the stepped regions on the electrically conductive posts to be stair-like. It is also desirable for the stepped regions to have channels.

These and other objects, aspects and advantages of the present invention will become apparent to those skilled in the art from the following detailed description and appended claims when read and understood in conjunction with the accompanying drawings.

DETAILED DESCRIPTION OF THE INVENTION

Embodiments of the invention are described below in detail with reference to the accompanying drawings. Members having substantially the same function are designated by the same reference numbers and symbols in all the drawings.

First Embodiment

Figure 1:
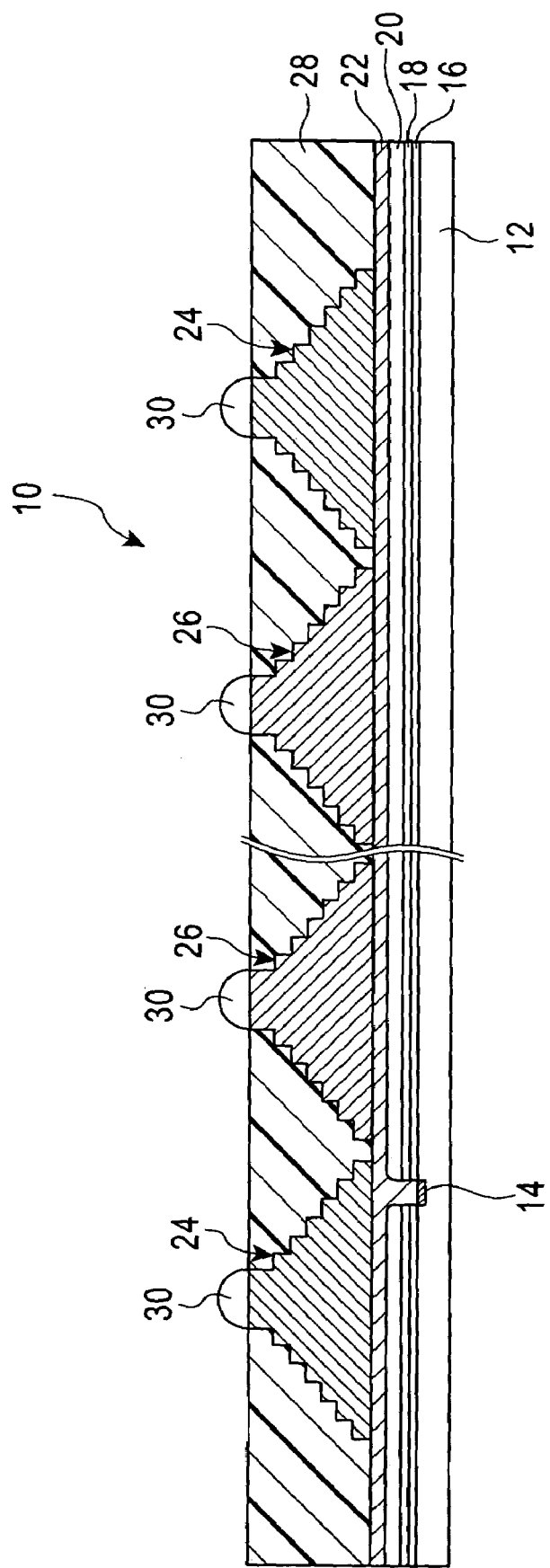
FIG. 1 is a schematic cross-sectional view of a semiconductor device according to a first embodiment of the invention.
Figure 2:
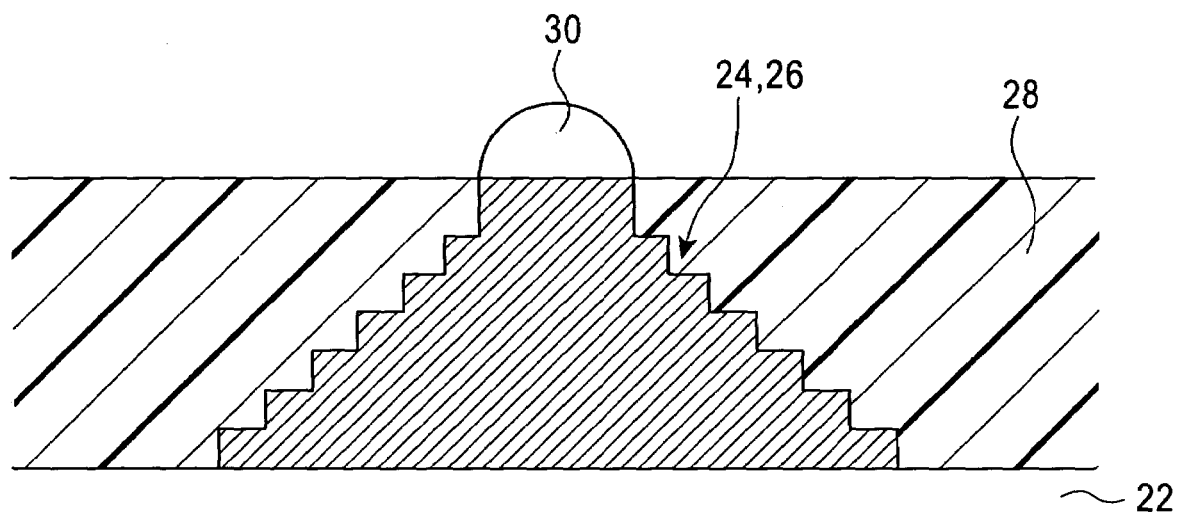
FIG. 2 is a partially enlarged view of a functional bump and a dummy bump in the semiconductor device shown in FIG. 1.
Figure 3:
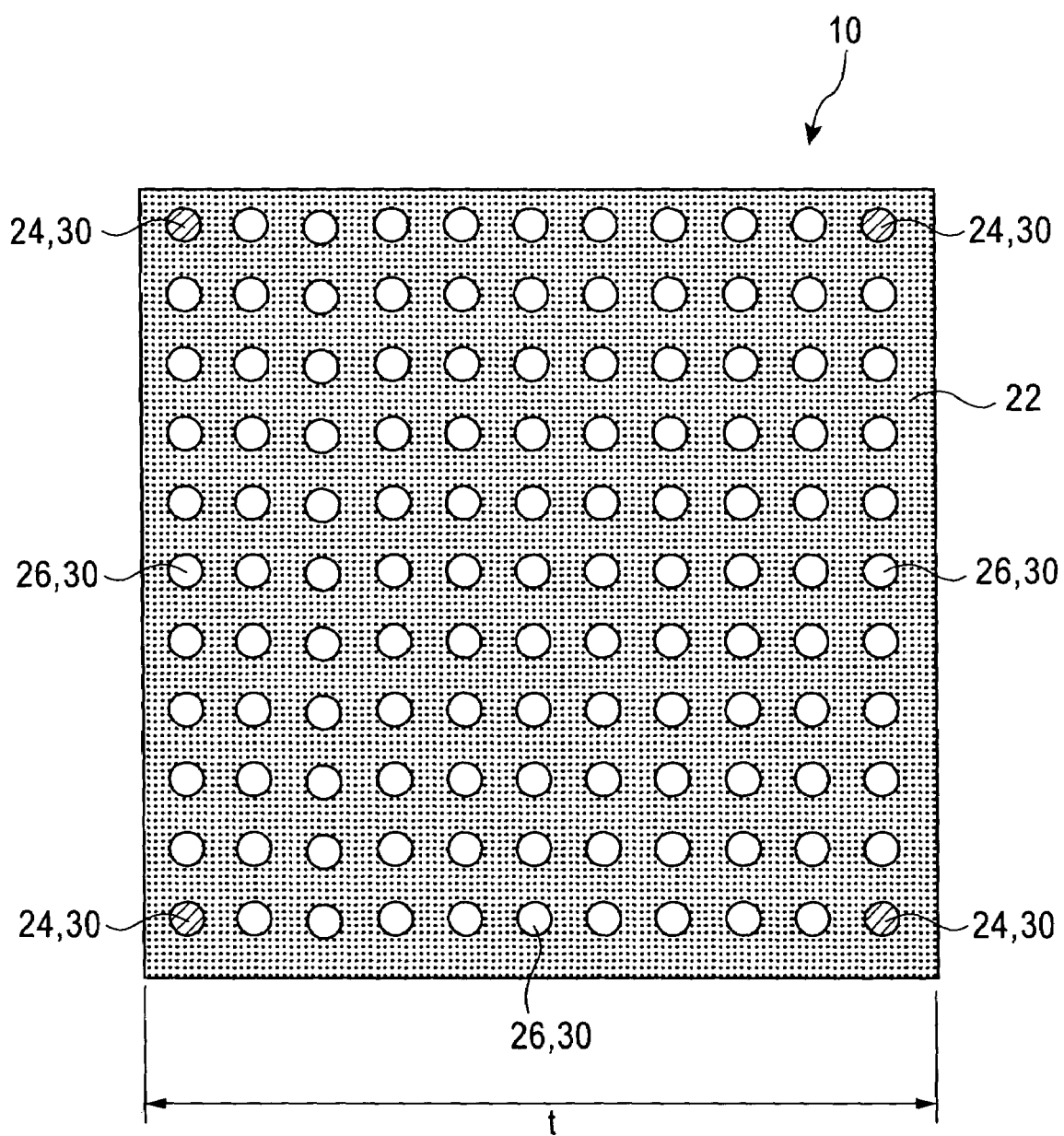
FIG. 3 is a schematic top view of the semiconductor device shown in FIG. 1.
Figure 4:
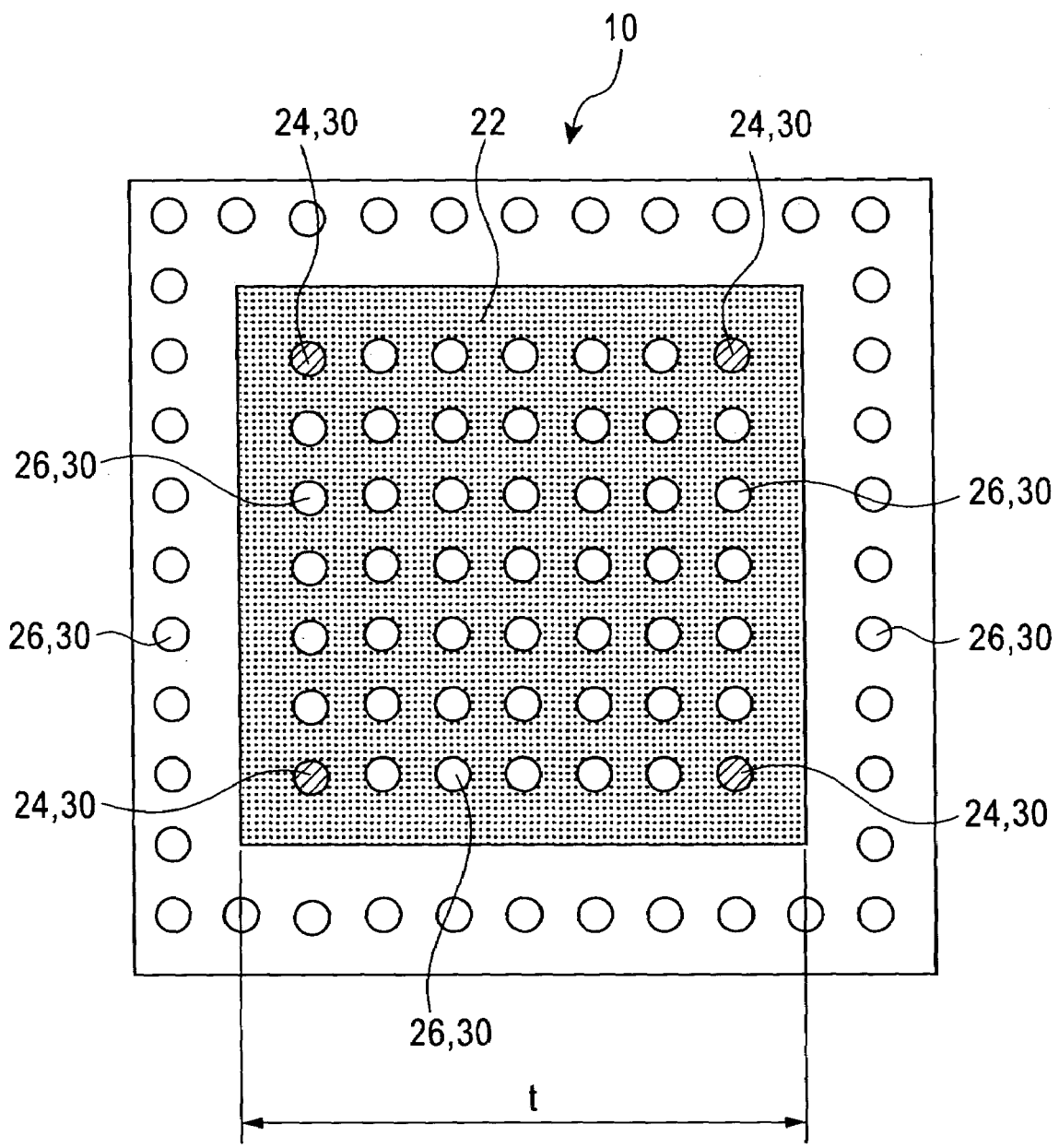
FIG. 4 is a schematic top view of another example of the semiconductor device.
Figure 5:
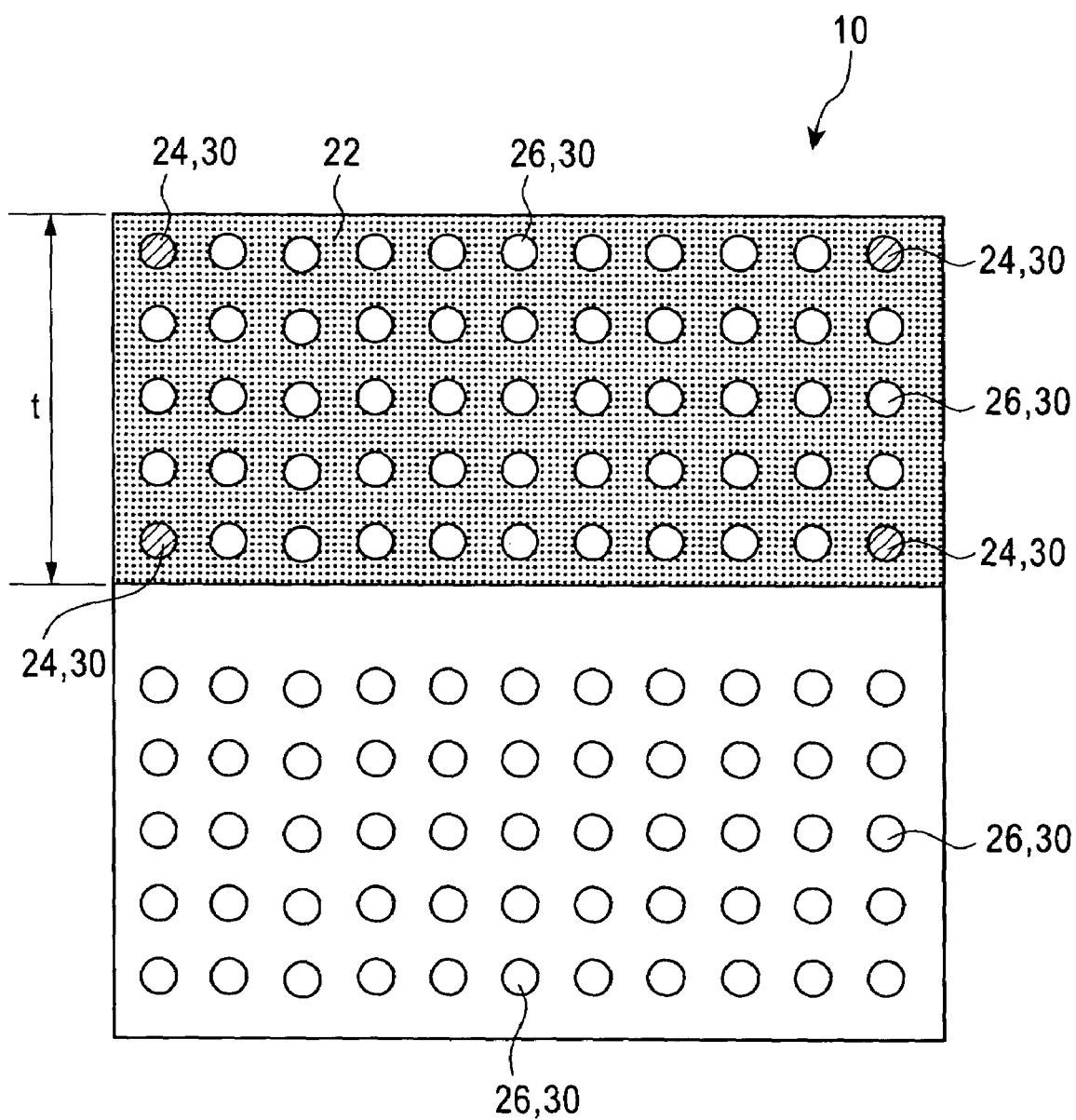
FIG. 5 is a schematic top view of yet another example of the semiconductor device.
Figure 6:
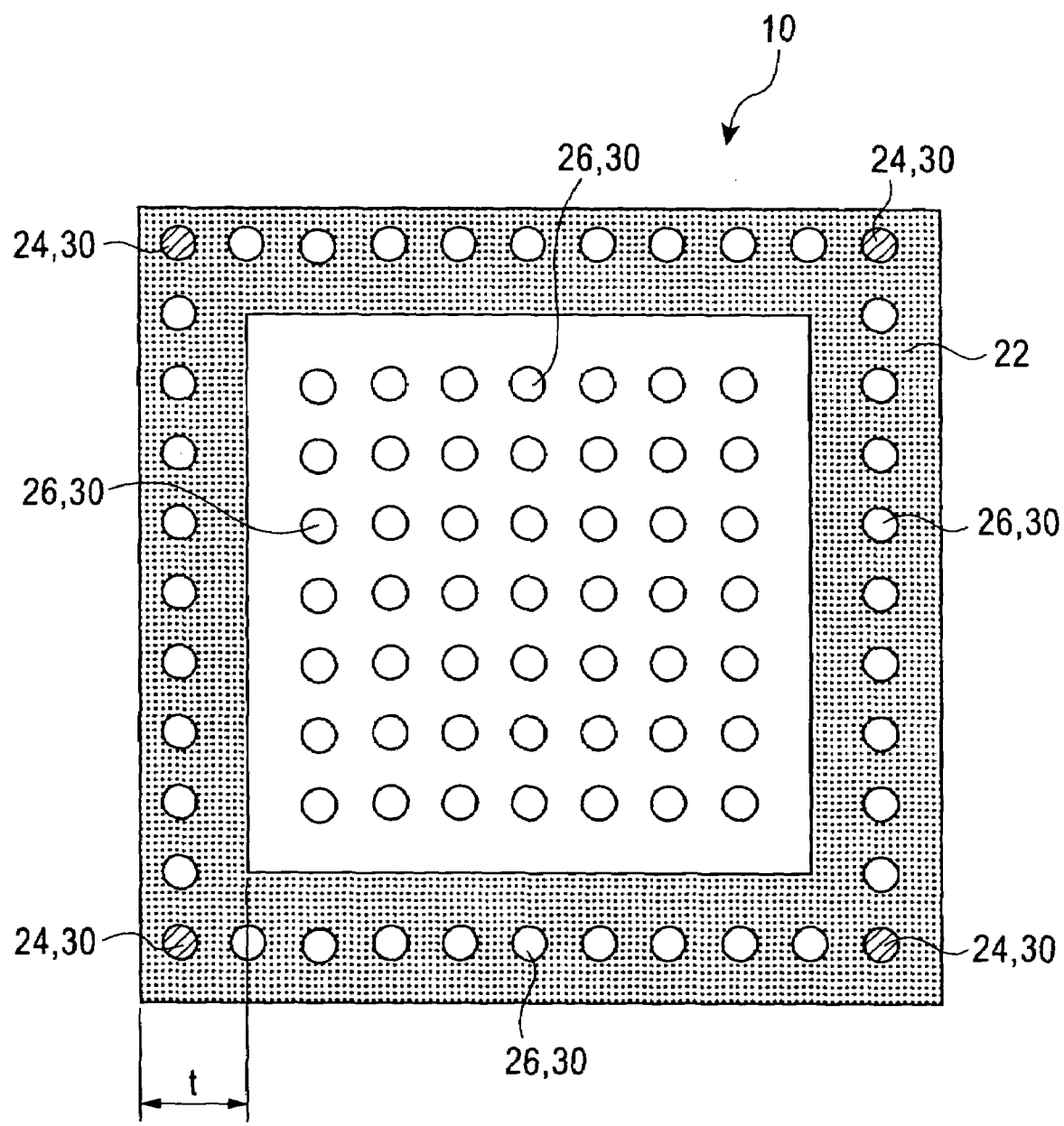
FIG. 6 is a schematic plan view of a still further example of the semiconductor device.

Referring to FIGS. 1 and 2, a semiconductor device 10 according to this embodiment has a semiconductor chip 12 on a surface (first major surface) of which are formed an integrated circuit (not shown) and pads 14. The pads 14 are electrically connected to the integrated circuit. The semiconductor device 10 also has a protective film 16 on a surface of the semiconductor chip 12. The protective film 16 protects a surface of the integrated circuit. On top of the protective film 16, the semiconductor device 10 has an intervening insulation film 18 made of a suitable material such as a polyimide resin film, an intervening under-barrier metallization (UBM) layer 20 typically of a titanium layer/copper layer construction, and a redistribution layer 22 for rerouting the pads 14. The redistribution layer 22 is electrically connected to the pads 14.

The redistribution layer 22 is provided thereon with functional bumps 24 which are electrically connected to the redistribution layer 22. The redistribution layer 22 and the functional bumps 24 are encapsulated by an encapsulating resin layer 28. Each functional bump 24 is provided at a tip thereof, which emerges from the encapsulating resin layer 28, with a protruding electrode 30 as an external terminal. The functional bump 24 is made of an electrically conductive material such as copper or tungsten, and serves to electrically connect the integrated circuit to the exterior.

The redistribution layer 22 is also provided thereon with dummy bumps 26 which are electrically connected to the redistribution layer 22. The dummy bumps 26 also are encapsulated, together with the redistribution layer 22 and the functional bumps 24, by the encapsulating resin layer 28. Each dummy bump 26 is provided at a tip thereof, which emerges from the encapsulating resin layer 28, with a protruding electrode 30 as an external terminal. The dummy bumps 26 are not electrically connected to the exterior. The dummy bumps 26 are made of an electrically conductive material such as copper or tungsten and can be provided in the same manufacturing process as the functional bumps 24. The projecting electrodes 30 prevent oxidation of the dummy bumps 26 which emerge from the encapsulating resin layer 28.

It should be noted that the dummy bumps 26 may be given a lower height (measured in the height or thickness direction of the semiconductor chip 12) than the functional bumps 24, such that the dummy bumps 26 do not emerge from the encapsulating resin layer 28. That is, the dummy bumps 26 may be buried within the encapsulating resin layer 28.

The functional bumps 24 and dummy bumps 26 have stair-like stepped regions on sidewalls thereof in contact with the encapsulating resin layer 28. The functional bumps 24 and dummy bumps 26 having stair-like stepped regions on the sidewalls can be formed by subjecting the redistribution layer 22 successively to photolithography and plating or the application of a thick plating layer followed successively by photolithography and etching, the process being repeated as many times as is necessary.

Both the functional bumps 24 and dummy bumps 26 may be referred to as stepped members. Alternatively, the functional bumps 24 and dummy bumps 26 may be referred to as first electrically conductive posts and second electrically conductive posts, respectively.

The redistribution layer 22, as shown in FIGS. 3 to 6 for example, has a pattern with a large surface area (patterning width) relative to the surface of the semiconductor chip 12. Specifically, the patterning width (indicated as "t" in FIGS. 3 to 6) of the redistribution layer is preferably a minimum of at least 15 µm. In these diagrams, the dummy bumps 26 (indicated together with the protruding electrodes 30) which are not provided on the redistribution layer 22 are electrically unconnected to the redistribution layer 22 provided on the dielectric film 18. The encapsulating resin layer 28 is omitted in the diagrams.

In this embodiment, providing the dummy bumps 26 in addition to the functional bumps 24 divides the encapsulating resin layer 28 into more sections. Thus, it is possible to alleviate thermal stress acting upon the encapsulating resin layer 28.

Since the functional bumps 24 and dummy bumps 26 have the stepped regions, an anchoring effect is elicited by the corners in the stepped regions, thereby causing the functional bumps 24 and dummy bumps 26 to bond firmly with the encapsulating resin layer 28.

By having the stepped regions be stair-like, the functional bumps 24 and dummy bumps 26 can be provided with a larger number of stepped regions. This provides a greater anchoring effect. To the extent that the functional bumps 24 and dummy bumps 26 are provided with the stair-like stepped regions, the surface area of contact with the encapsulating resin layer 28 becomes larger, the anchoring effect due to the small irregularities at the surface of the functional bumps 24 and dummy bumps 26 increases, and a stronger bond is achieved.

Because the dummy bumps 26 which are electrically unconnected to the exterior are electrically connected to the redistribution layer 22, the surface area of the redistribution layer 22 is larger to the extent that such dummy bumps 26 are provided thereon.

Therefore, even in the semiconductor device 10 which includes a redistribution layer 22 having a large surface area (patterning width) with respect to the surface of the semiconductor chip 12, as shown in FIGS. 3 to 6, the bonding effect of the encapsulating resin layer 28 can be enhanced so that the separation of the encapsulating resin layer 28 is effectively prevented. Moreover, the power supply impedance can be minimized.

Second Embodiment

The second embodiment is a modification to the first embodiment. Differences between the first and second embodiments are described below with reference to FIG. 7 and FIG. 8.

Figure 7:
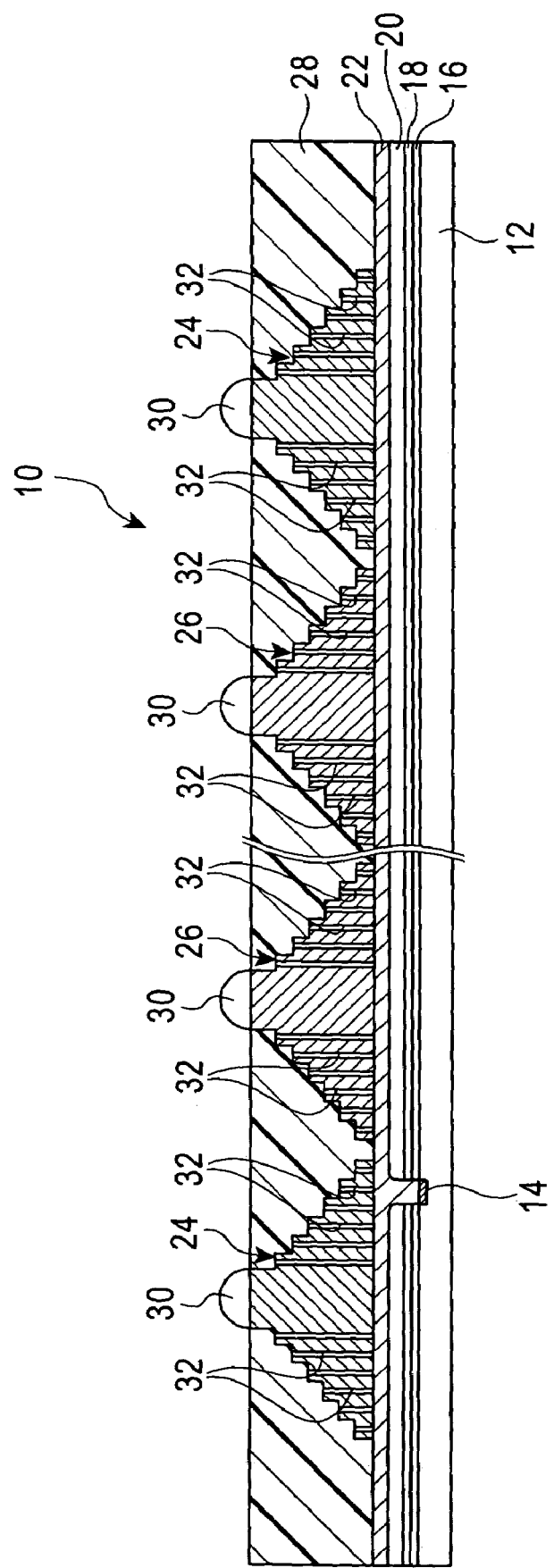
FIG. 7 is a schematic cross-sectional view of a semiconductor device according to a second embodiment of the invention.
Figure 8:
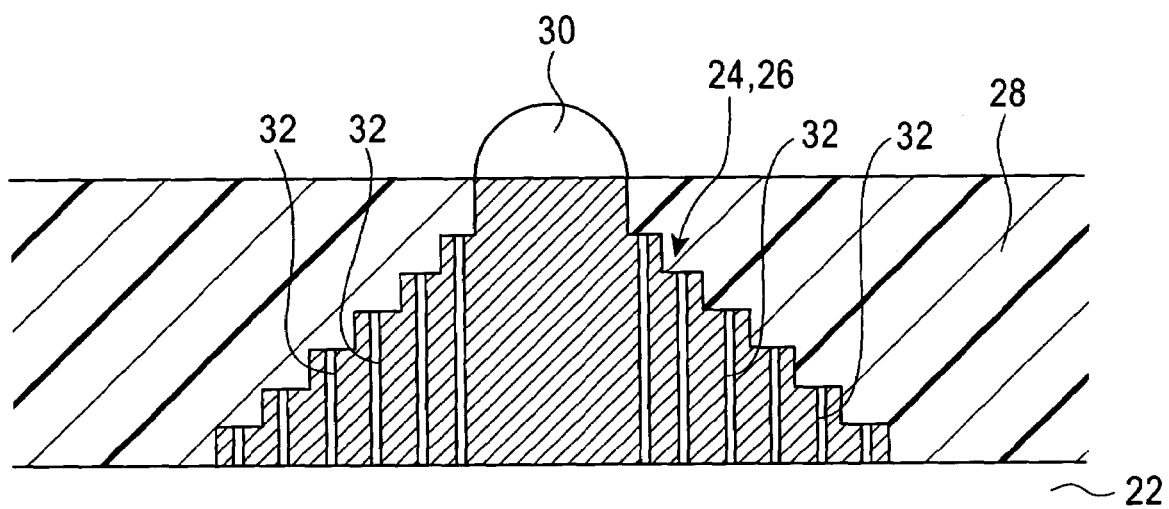
FIG. 8 is a partially enlarged view of a functional bump and a dummy bump in the semiconductor device shown in FIG. 7.

FIG. 7 is a schematic cross-sectional view of a semiconductor device 10 according to a second embodiment of the invention. FIG. 8 is a partially enlarged view of a functional bump and a dummy bump in the semiconductor device 10 shown in FIG. 7.

The semiconductor device 10 has holes (or channels or grooves) 32 in the functional bumps 24 and dummy bumps 26. Each hole 32 has a depth in a direction perpendicular to the surface of a semiconductor chip 12, and extends from the surface of contact between the functional bump 24 (or the dummy bump 26) and the encapsulating resin layer 28. The holes 32 create additional stepped regions in the functional bumps 24 and dummy bumps 26.

Using the semiconductor device of the first embodiment, the holes 32 can be made by, for example, etching the functional bumps 24. It should be noted that if the stair-like stepped regions have a larger number of steps, etching may be difficult. In such a case, the functional bumps 24 and dummy bumps 26 can be easily provided with the stair-like stepped regions and holes 32 by successively carrying out photolithography and plating as many times as is necessary.

In this embodiment, by providing the functional bumps 24 and the dummy bumps 26 with the vertical holes 32, a larger number of stepped regions are additionally formed. Thus, the second embodiment can achieve an even better anchoring effect than the first embodiment. Moreover, the contact surface areas between the functional bumps 24 and encapsulating resin layer 28 and between the dummy bumps 26 and encapsulating resin layer 28 are also increased so that even firmer bonds are achieved between the functional bumps 24 and encapsulating resin layer 28, and between the dummy bumps 26 and encapsulating resin layer 28.

Third Embodiment

Figure 9:
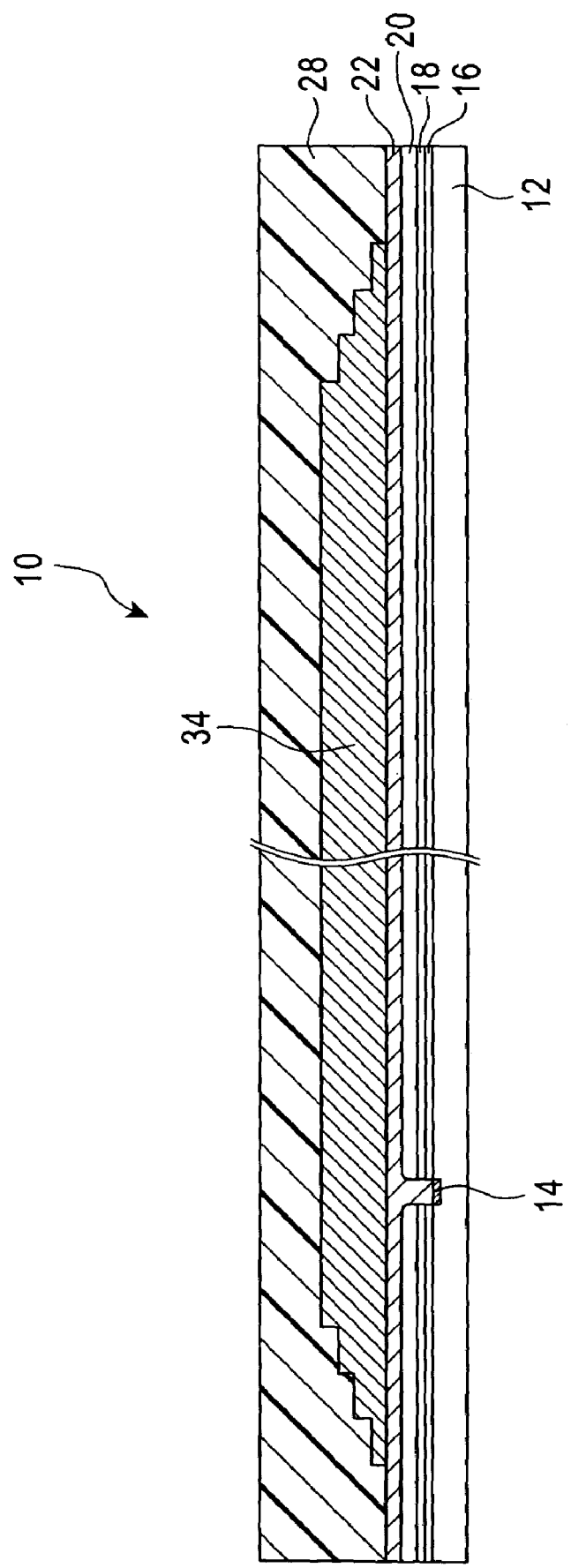
FIG. 9 is a schematic cross-sectional view of a semiconductor device according to a third embodiment of the invention.

FIG. 9 is a schematic cross-sectional view of a semiconductor device 10 according to a third embodiment of the invention.

In this semiconductor device 10, the redistribution layer 22 has stacked thereon a second redistribution layer 34. The second redistribution layer 34 is provided with stair-like stepped regions. The second redistribution layer 34 with the stair-like stepped regions can be formed together with the first redistribution layer 22 in the same manufacturing process by subjecting the first redistribution layer 22 successively to photolithography and plating or the application of a thick plating layer followed successively by photolithography and etching, the process being repeated as many times as is necessary. Because the third embodiment is in other respects the same as the first embodiment, no further description is provided here.

The second redistribution layer 34 having the stair-like stepped regions may be referred to as the stepped member. The functional bumps 24 are omitted in FIG. 9.

Thus, in this embodiment, as in the first embodiment, even if the semiconductor device 10 includes the redistribution layer 22 having a large surface area (patterning width) with respect to the semiconductor chip 12 surface as shown in FIGS. 3 to 6, the redistribution layer 34 having the stair-like stepped regions enhances the bonding effect of the encapsulating resin layer 28. This effectively prevents the separation of the encapsulating resin layer 28. Providing such a redistribution layer 34 also enables the power supply impedance to be minimized.

Fourth Embodiment

Figure 10:
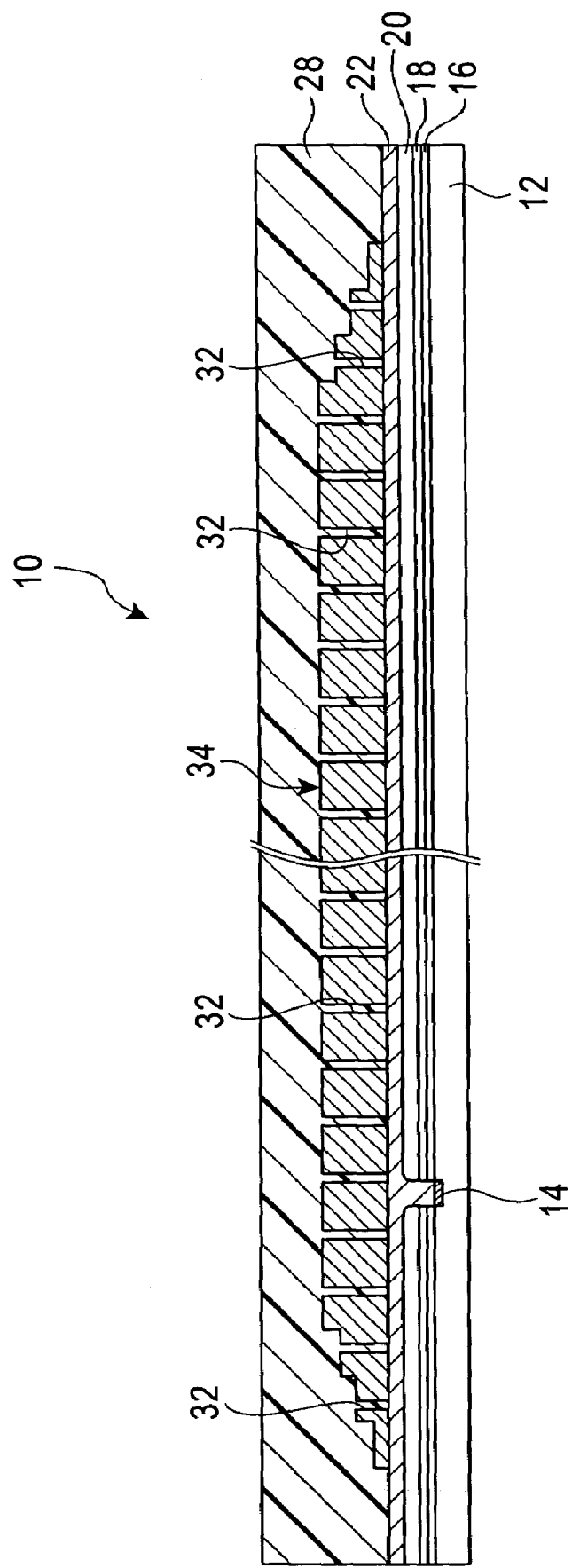
FIG. 10 is a schematic cross-sectional view of a semiconductor device according to a fourth embodiment of the invention.

FIG. 10 is a schematic cross-sectional view of a semiconductor device 10 according to a fourth embodiment of the invention.

The semiconductor device 10 is a modification to the third embodiment. A modification made in the second embodiment (provision of the holes 32) is applied.

The semiconductor device 10 of the fourth embodiment has holes 32, which are formed in the second redistribution layer 34. Each hole 32 has a depth in a direction perpendicular to the surface of the semiconductor chip 12. The holes 32 are provided in the same manner as in the second embodiment. The holes 32 provide additional stepped regions.

Hence, in this embodiment, as in the second embodiment, the semiconductor device 10 has a larger number of stepped regions. As a result, an even better anchoring effect can be achieved than in the third embodiment. Because the contact surface area between the redistribution layer 34 and the encapsulating resin layer 28 is increased, a stronger bond is achieved between the redistribution layer 34 and the encapsulating resin layer 28.

Fifth Embodiment

Figure 11:
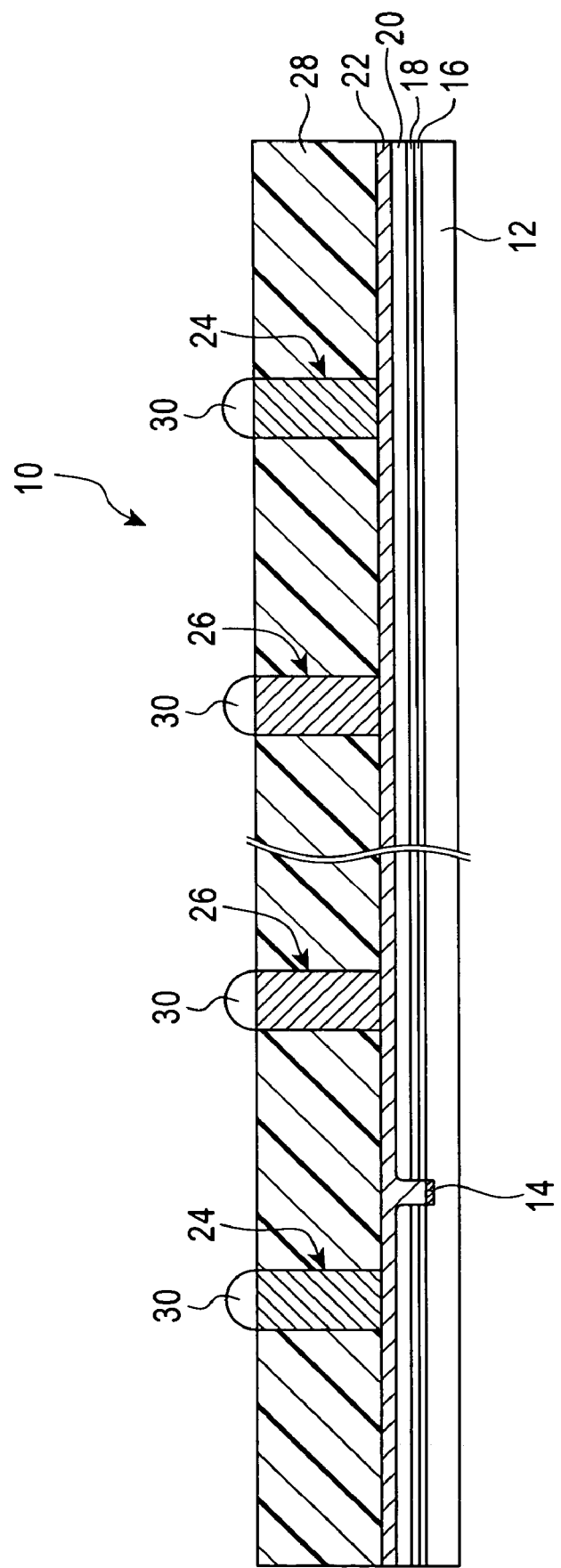
FIG. 11 is a schematic cross-sectional view of a semiconductor device according to a fifth embodiment of the invention.

FIG. 11 is a schematic cross-sectional view of a semiconductor device according to a fifth embodiment of the invention. The fifth embodiment is a modification to the first embodiment.

In the semiconductor device 10 of the present embodiment, the functional bumps 24 and dummy bumps 26 are not provided with the stair-like stepped regions. Instead, the number of the dummy bumps 26 is increased.

When numerous dummy bumps 26 are provided, the dummy bumps 26 sufficiently divide up the encapsulating resin layer 28, thereby enabling thermal stresses upon the encapsulating resin layer 28 to be adequately alleviated. Compared with the first and second embodiments, the photolithography processes and plating processes can be reduced while at the same time enhancing the bonding effect of the encapsulating resin layer and thus enabling separation of the encapsulating resin layer 28 to be effectively prevented. In addition, the power supply impedance can be minimized.

It should be noted that the present invention is not limited to the above described five embodiments.

The semiconductor devices 10 according to all of the first to fifth embodiments deal with chip-size packages of the type referred to as "W-CSP," which, as noted above, are packaged at the wafer level then singulated, and which have outside dimensions that are nearly chip size. However, the invention is not limited to such semiconductor devices, and may also be applied to any semiconductor devices having a redistribution layer 22 covered with the encapsulating resin layer 28. A more detailed description of W-CSP devices may be found in, for example, Japanese Patent Kokai No. 9-64049, the entire disclosure of which is incorporated herein by reference.

Several embodiments of the semiconductor device of the present invention have been disclosed herein for illustrative purposes and are not intended to be limitative. Those skilled in the art will appreciate that various changes, modifications, additions and substitutions are possible without departing from the scope and spirit of the invention as defined by the appended claims.

This application is based on a Japanese Patent Application No. 2004-146645 filed on May 17, 2004 and the entire disclosure thereof is incorporated herein by reference.

What is claimed is:

1. A semiconductor device comprising:
   a semiconductor chip having a first surface;
   an integrated circuit provided on the first surface of the semiconductor chip;
   a redistribution layer formed on a first surface side of the semiconductor chip and electrically connected to the integrated circuit;
   a resin layer for encapsulating the redistribution layer from the first surface side of the semiconductor chip; and
   a plurality of stepped members formed on the first surface side of the semiconductor chip, and encapsulated together with the redistribution layer by the resin layer, the stepped members having at least one stepped region that defines part of a contact area between the stepped member and the resin layer, wherein the stepped members include a functional stepped member which is electrically connected to an exterior and a dummy stepped member which is not electrically connected to the exterior.

2. The semiconductor device according to claim 1, wherein the stepped region of the stepped member is stair-like.

3. The semiconductor device according to claim 1 further including at least one channel formed in the stepped region.

4. The semiconductor device according to claim 3, wherein each said channel extends in a direction perpendicular to the first surface of the semiconductor chip.

5. The semiconductor device according to claim 1, wherein the stepped member is made of an electrically conductive material.

6. The semiconductor device according to claim 5, wherein the stepped member is electrically connected to the redistribution layer.

7. The semiconductor device according to claim 1, wherein the stepped member has small convex on its surface.

8. The semiconductor device according to claim 1, the stepped member includes a second redistribution layer.

9. The semiconductor device according to claim 1, further comprising an insulating layer formed on the integrated circuit and the first surface of the semiconductor chip.

10. The semiconductor device according to claim 9, wherein the functional stepped member is formed on the redistribution layer, and the dummy stepped member is formed on the insulating layer.

11. The semiconductor device according to claim 10, wherein the functional stepped member is electrically connected to the redistribution layer, and the dummy stepped member is not electrically connected to the redistribution layer.

* * * * *